United States Patent
Brown et al.

(10) Patent No.: US 8,861,127 B2
(45) Date of Patent: Oct. 14, 2014

(54) MAGNETIC STORAGE DEVICE WITH DYNAMIC HUMIDITY CONTROL SYSTEM TO MITIGATE WATER VAPOR TRANSIENTS

(75) Inventors: Charles Allan Brown, San Jose, CA (US); Bruno Marchon, Palo Alto, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 13/212,038

(22) Filed: Aug. 17, 2011

(65) Prior Publication Data

US 2013/0044393 A1    Feb. 21, 2013

(51) Int. Cl.
  *G11B 33/14* (2006.01)
  *H05K 5/02* (2006.01)
  *G11B 25/04* (2006.01)

(52) U.S. Cl.
  CPC .......... *H05K 5/0213* (2013.01); *G11B 33/1453* (2013.01); *G11B 25/043* (2013.01)
  USPC ...................................................... 360/97.16

(58) Field of Classification Search
  USPC ................. 360/97.02, 97.13, 97.16
  See application file for complete search history.

(56) References Cited

U.S. PATENT DOCUMENTS

| | | |
|---|---|---|
| 4,831,475 A | 5/1989 | Kakuda et al. |
| 4,857,087 A | 8/1989 | Bolton et al. |
| 4,977,009 A | 12/1990 | Anderson et al. |
| 5,009,308 A | 4/1991 | Cullen et al. |
| 5,075,807 A | 12/1991 | Inoue et al. |
| 5,367,417 A | 11/1994 | Brown et al. |
| 5,650,890 A | 7/1997 | Kuroki et al. |
| 5,734,521 A | 3/1998 | Fukudome et al. |
| 5,754,366 A | 5/1998 | Yoshino |
| 6,226,890 B1 * | 5/2001 | Boroson et al. ............... 34/472 |
| 6,296,691 B1 | 10/2001 | Gidumal |
| 6,683,746 B1 | 1/2004 | Kuroki et al. |
| 6,765,753 B2 | 7/2004 | Takami |
| 7,123,440 B2 | 10/2006 | Albrecht et al. |
| 7,137,196 B2 | 11/2006 | Gunderson et al. |

(Continued)

FOREIGN PATENT DOCUMENTS

| | | |
|---|---|---|
| DE | 3639783 A * | 5/1988 |
| EP | 1369173 | 12/2003 |
| WO | WO2004043573 | 5/2004 |
| WO | WO2009041950 | 4/2009 |

OTHER PUBLICATIONS

Keenan, M.R., Moisture Control in Sealed Electronic Packages, Feb. 1990, Sandia Nationa Laboratories, Sandia Report SAND89-2106 UC-706, pp. 6-8, 17, 39-40, 68-69.*

(Continued)

*Primary Examiner* — Craig A. Renner
*Assistant Examiner* — Carlos E Garcia
(74) *Attorney, Agent, or Firm* — Brokaw Patent Law PC; Christopher J. Brokaw

(57) ABSTRACT

Approaches for desiccant device within an enclosure protecting sensitive electronic equipment. Electronic equipment, such as a hard-disk drive (HDD), may comprise a desiccant device that possesses a water vapor permeability rate that matches or is substantially similar to the water vapor permeability rate of the enclosure. In this way, desiccant devices may prevent the desiccant material enclosed within from releasing large amounts of humidity into the interior of the electronic equipment.

20 Claims, 3 Drawing Sheets

(56) References Cited

U.S. PATENT DOCUMENTS

| | | | |
|---|---|---|---|
| 7,166,142 B2* | 1/2007 | Tuma et al. | 55/385.6 |
| 7,306,659 B2* | 12/2007 | Gorton et al. | 96/134 |
| 7,318,859 B2 | 1/2008 | Ball et al. | |
| 7,460,333 B2 | 12/2008 | Akamatsu et al. | |
| 7,591,868 B2 | 9/2009 | Johnson | |
| 7,703,291 B2 | 4/2010 | Bushnik et al. | |
| 7,815,127 B2 | 10/2010 | Beatty et al. | |
| 2002/0012808 A1 | 1/2002 | Ishizaki et al. | |
| 2002/0139127 A1 | 10/2002 | Kesten et al. | |
| 2003/0037677 A1 | 2/2003 | Boroson et al. | |
| 2003/0142438 A1 | 7/2003 | Brown et al. | |
| 2003/0169532 A1* | 9/2003 | Takami | 360/97.02 |
| 2004/0231518 A1 | 11/2004 | Johnson et al. | |
| 2005/0219740 A1 | 10/2005 | Repphun et al. | |
| 2005/0270690 A1 | 12/2005 | Gunderson | |
| 2006/0050429 A1 | 3/2006 | Gunderson et al. | |
| 2006/0066974 A1 | 3/2006 | Akamatsu et al. | |
| 2006/0171065 A1 | 8/2006 | Akamatsu et al. | |
| 2006/0232891 A1 | 10/2006 | Bushnik et al. | |
| 2008/0180835 A1 | 7/2008 | Strom et al. | |
| 2008/0239549 A1 | 10/2008 | Lee | |
| 2008/0310048 A1 | 12/2008 | Hirono et al. | |
| 2009/0025561 A1 | 1/2009 | Tuma | |
| 2009/0090245 A1 | 4/2009 | Olszewski | |
| 2009/0116141 A1 | 5/2009 | Brown | |
| 2009/0188386 A1 | 7/2009 | Beatty et al. | |
| 2010/0031817 A1 | 2/2010 | Ehrenberg et al. | |
| 2010/0296191 A1 | 11/2010 | Kim et al. | |
| 2010/0321821 A1 | 12/2010 | Iwase | |
| 2011/0109989 A1 | 5/2011 | Turner et al. | |

OTHER PUBLICATIONS

Intel, "Moisture Sensitivity/Desiccant Packaging/Handling of PSMCS", Packaging Databook/Intel, 27 pages, 2000.

AGM Container Controls, Inc., Desiccators—Desiccant Baskets & Access Ports, AGM Catalog 05D, 20 pages (No date provided).

Wang, R. et al., "Enhanced Reliability of Hard Disk Drive by Vapor Corrosion Inhibitor", IEEE, 1 page, Jun. 2007.

Mitsuo Kobayashi et al., "Next Generation HDI Technologies for Magnetic Hard Disks", vol. 46, No. 1 Fuji Electric Review, 6 pages (no date provided).

W.L. Gore & Associates, Inc., "Disk Drive Filters, Adsorbent Box, Providing Maximum Contamination Control in One Package", W.L. Gore & Associates, 2 pages, 2006.

\* cited by examiner

MAGNETIC STORAGE DEVICE WITH DYNAMIC HUMIDITY CONTROL SYSTEM TO MITIGATE WATER VAPOR TRANSIENTS

RELATED APPLICATION DATA

This application is related to U.S. patent application Ser. No. 13/211,826, entitled "Magnetic Storage Device with Humidity Control Device Incorporating a Differentially Permeable Membrane," invented by Charles Allan Brown, filed on Aug. 17, 2011, the disclosure of which is incorporated by reference in its entirety for all purposes as if fully set forth herein.

This application is related to U.S. patent application Ser. No. 13/211,748, entitled "Magnetic Storage Device with Multi-Functional Component for Controlling Chemical and Water Vapor Therein," invented by Charles Allan Brown, filed on Aug. 17, 2011, the disclosure of which is incorporated by reference in its entirety for all purposes as if fully set forth herein.

FIELD OF THE INVENTION

Embodiments of the invention generally relate to adjusting the water vapor permeability of a desiccant device used in a sensitive electronic device.

BACKGROUND OF THE INVENTION

A hard-disk drive (HDD) is a non-volatile storage device that is housed in a protective enclosure and stores digitally encoded data on one or more circular disks having magnetic surfaces (a disk may also be referred to as a platter). When an HDD is in operation, each magnetic-recording disk is rapidly rotated by a spindle system. Data is read from and written to a magnetic-recording disk using a read/write head which is positioned over a specific location of a disk by an actuator.

A read/write head uses a magnetic field to read data from and write data to the surface of a magnetic-recording disk. As a magnetic dipole field decreases rapidly with distance from a magnetic pole, the distance between a read/write head and the surface of a magnetic-recording disk must be tightly controlled. An actuator relies on suspension's force on the read/write head to provide the proper distance between the read/write head and the surface of the magnetic-recording disk while the magnetic-recording disk rotates. A read/write head therefore is said to "fly" over the surface of the magnetic-recording disk. When the magnetic-recording disk stops spinning, a read/write head must either "land" or be pulled away onto a mechanical landing ramp from the disk surface. Because the read/write head flies so close to the surface of the magnetic-recording disk, the components within the HDD may be sensitive to moisture, contaminants, and other impurities and imperfections within the protective enclosure of the HDD.

Modern HDDs have a very thin overcoat and lubricant layers as well as very thin or even absent protective layers on the read and write heads. To protect high performance drives against corrosion and other negative outcomes, it is desirable to control the relative humidity within the drives. This has been accomplished in certain HDDs through the use of desiccants.

During either the manufacturing of a HDD or a long storage time of the HDD in a high humidity environment, the desiccant within the HDD can absorb a large quantity of moisture. When the HDD is powered on, the desiccant may then release a large quantity of water vapor, particularly when the HDD is operating under high temperature. The large quantity of water vapor released by the desiccant creates a high water vapor concentration within the HDD, which can cause severe reliability problems, such as lubricant pickup and loss of flying height for example.

To avoid this problem in manufacturing, the amount of time that the desiccant is exposed to the environment is tightly controlled. For example, desiccants may be kept in a dry environment until the last moment before they need to be installed into the HDD. As another example, the amount of time that an HDD is open and exposed to the outside environment may be minimized once the desiccant is installed. These strict procedures are detrimental to manufacturing flexibility and rework of the HDD.

When a HDD is stored for a long time under humid conditions, it is necessary to adjust the packaging of the HDD so that the packaging helps limit moisture intake. Desiccant packages in shipping boxes are also sometimes used, but their use is increasingly limited due to environmental concerns.

SUMMARY OF THE INVENTION

It is observed that the ability of desiccants to absorb and release moisture has not adapted to the speed at which moisture enters and exits the sensitive electronic equipment (such as a hard-disk drive (HDD)) in which the desiccant is deployed. Applicant has discovered that by matching the water vapor permeability of the desiccant to that of the electronic equipment in which the desiccant resides, the undesirable situation where the desiccant releases large amounts of humidity into the interior of the electronic equipment deploying the desiccant may be avoided.

Embodiments of the invention provide a hard-disk drive that comprises a desiccant device that encloses a desiccant material. Desiccant material is a material that absorbs water/water vapor. Thus, the desiccant material induces or sustains a state of dryness (desiccation) in the electronic equipment in which it resides. The desiccant device possesses a water vapor permeability rate that matches or is substantially similar to the water vapor permeability rate of the enclosure of the electronic equipment. In this way, embodiments may be used to prevent the desiccant material enclosed within the desiccant device from releasing large amounts of humidity into the interior of the electronic equipment.

Embodiments discussed in the Summary of the Invention section are not meant to suggest, describe, or teach all the embodiments discussed herein. Thus, embodiments of the invention may contain additional or different features than those discussed in this section.

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION OF THE INVENTION

Approaches for adjusting the water vapor permeability of a desiccant device used within electronic equipment to reflect the water vapor permeability of the enclosure of the electronic equipment in which the desiccant device resides are described. Embodiments may be used to prevent the desiccant material enclosed within the desiccant device from releasing large amounts of humidity into the interior of the electronic equipment. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form in order to avoid unnecessarily obscuring the embodiments of the invention described herein.

Physical Description of Illustrative Embodiments of the Invention

Embodiments of the invention may be used to prevent a desiccant, used in a hard-disk drive (HDD), from releasing large amounts of humidity into the interior of the HDD. For purposes of providing a concrete example, particular embodiments of the invention shall be described with reference to a hard-disk drive (HDD). However, desiccants according to embodiments of the invention may be used within the interior of many types of electronic equipment. Consequently, embodiments of the invention need not be limited to use within a HDD, since embodiments of the invention have broader applicability.

Figure 1:
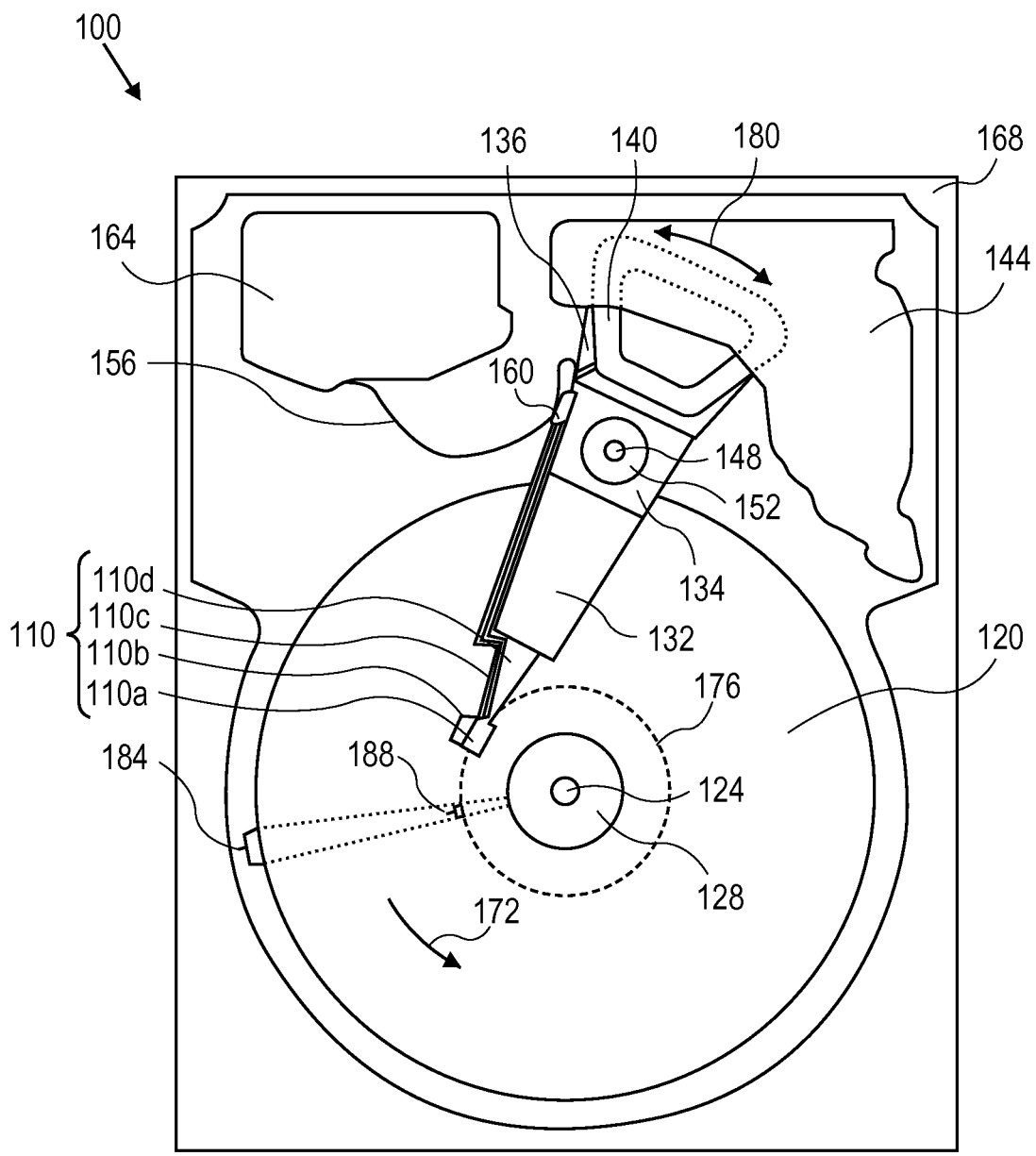
FIG. 1 is a plan view of an HDD according to an embodiment of the invention.

In accordance with an embodiment of the invention, a plan view of a HDD 100 is shown in FIG. 1. FIG. 1 illustrates the functional arrangement of components of the HDD including a slider 110b that includes a magnetic-recording head 110a. The HDD 100 includes at least one head gimbal assembly (HGA) 110 including the head 110a, a lead suspension 110c attached to the head 110a, and a load beam 110d attached to the slider 110b, which includes the head 110a at a distal end of the slider 110b; the slider 110b is attached at the distal end of the load beam 110d to a gimbal portion of the load beam 110d. The HDD 100 also includes at least one magnetic-recording disk 120 rotatably mounted on a spindle 124 and a drive motor (not shown) attached to the spindle 124 for rotating the disk 120. The head 110a includes a write element and a read element for respectively writing and reading information stored on the disk 120 of the HDD 100. The disk 120 or a plurality (not shown) of disks may be affixed to the spindle 124 with a disk clamp 128. The HDD 100 further includes an arm 132 attached to the HGA 110, a carriage 134, a voice-coil motor (VCM) that includes an armature 136 including a voice coil 140 attached to the carriage 134; and a stator 144 including a voice-coil magnet (not shown); the armature 136 of the VCM is attached to the carriage 134 and is configured to move the arm 132 and the HGA 110 to access portions of the disk 120 being mounted on a pivot-shaft 148 with an interposed pivot-bearing assembly 152.

With further reference to FIG. 1, in accordance with an embodiment of the present invention, electrical signals, for example, current to the voice coil 140 of the VCM, write signal to and read signal from the PMR head 110a, are provided by a flexible cable 156. Interconnection between the flexible cable 156 and the head 110a may be provided by an arm-electronics (AE) module 160, which may have an on-board pre-amplifier for the read signal, as well as other read-channel and write-channel electronic components. The flexible cable 156 is coupled to an electrical-connector block 164, which provides electrical communication through electrical feedthroughs (not shown) provided by an HDD housing 168. The HDD housing 168, also referred to as a casting, depending upon whether the HDD housing is cast, in conjunction with an HDD cover (not shown) provides a sealed, protective enclosure for the information storage components of the HDD 100.

With further reference to FIG. 1, in accordance with an embodiment of the present invention, other electronic components (not shown), including a disk controller and servo electronics including a digital-signal processor (DSP), provide electrical signals to the drive motor, the voice coil 140 of the VCM and the head 110a of the HGA 110. The electrical signal provided to the drive motor enables the drive motor to spin providing a torque to the spindle 124 which is in turn transmitted to the disk 120 that is affixed to the spindle 124 by the disk clamp 128; as a result, the disk 120 spins in a direction 172. The spinning disk 120 creates a cushion of air that acts as an air-bearing on which the air-bearing surface (ABS) of the slider 110b rides so that the slider 110b flies above the surface of the disk 120 without making contact with a thin magnetic-recording medium of the disk 120 in which information is recorded. The electrical signal provided to the voice coil 140 of the VCM enables the head 110a of the HGA 110 to access a track 176 on which information is recorded. Thus, the armature 136 of the VCM swings through an arc 180 which enables the HGA 110 attached to the armature 136 by the arm 132 to access various tracks on the disk 120. Information is stored on the disk 120 in a plurality of concentric tracks (not shown) arranged in sectors on the disk 120, for example, sector 184. Correspondingly, each track is composed of a plurality of sectored track portions, for example, sectored track portion 188. Each sectored track portion 188 is composed of recorded data and a header containing a servo-burst-signal pattern, for example, an ABCD-servo-burst-signal pattern, information that identifies the track 176, and error correction code information. In accessing the track 176, the read element of the head 110a of the HGA 110 reads the servo-burst-signal pattern which provides a position-error-signal (PES) to the servo electronics, which controls the electrical signal provided to the voice coil 140 of the VCM, enabling the head 110a to follow the track 176. Upon finding the track 176 and identifying a particular sectored track portion 188, the head 110a either reads data from the track 176 or writes data to the track 176 depending on instructions received by the disk controller from an external agent, for example, a microprocessor of a computer system.

Embodiments of the invention also encompass HDD 100 that includes the HGA 110, the disk 120 rotatably mounted on the spindle 124, the arm 132 attached to the HGA 110 including the slider 110b including the head 110a.

Figure 2:
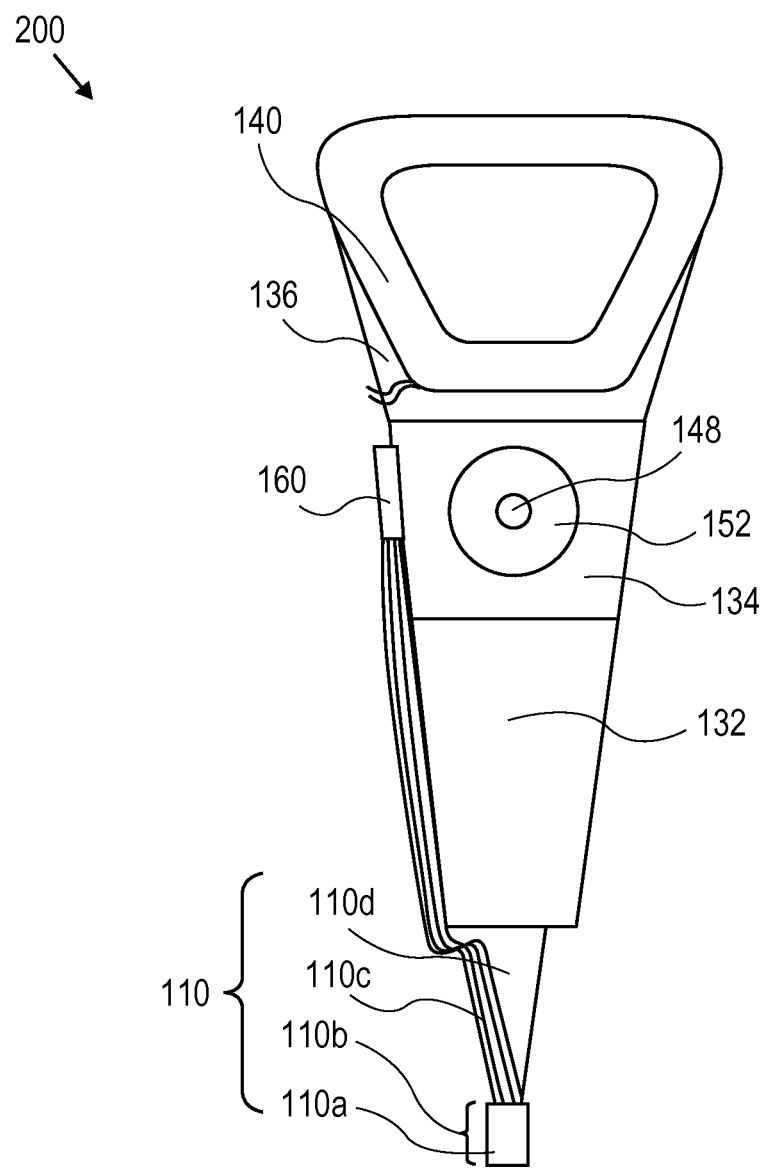
FIG. 2 is a plan view of a head-arm-assembly (HAA) according to an embodiment of the invention.

With reference now to FIG. 2, in accordance with an embodiment of the present invention, a plan view of a head-arm-assembly (HAA) including the HGA 110 is shown. FIG. 2 illustrates the functional arrangement of the HAA with respect to the HGA 110. The HAA includes the arm 132 and HGA 110 including the slider 110b including the head 110a. The HAA is attached at the arm 132 to the carriage 134. In the case of an HDD having multiple disks, or platters as disks are sometimes referred to in the art, the carriage 134 is called an "E-block," or comb, because the carriage is arranged to carry a ganged array of arms that gives it the appearance of a comb. As shown in FIG. 2, the armature 136 of the VCM is attached to the carriage 134 and the voice coil 140 is attached to the armature 136. The AE 160 may be attached to the carriage 134 as shown. The carriage 134 is mounted on the pivot-shaft 148 with the interposed pivot-bearing assembly 152.

Adjusting the Watr Vapor Permeability of a Desiccant Device Used Within the Interior of Electronic Equipment Embodiments of the invention advantageously provide for adjusting the water vapor permeability of a desiccant device used within a HDD to reflect the permeability of the HDD enclosure in which the desiccant device resides are described. As used herein, the term "desiccant device" refers to the physical enclosure that encloses or surrounds a desiccant material. A desiccant material is any material which is used to absorb water vapor within sensitive electronic equipment, such as, but not limited to, HDD 100.

Embodiments may be used to prevent the desiccant device from releasing humidity in the interior of HDD 100 at a rate too high to be desirable. In this way, the situation where the desiccant device releases a large amount of humidity within the interior of HDD 100 in a short period of time while the enclosure of HDD 100 does not have the capability to vent the water vapor quickly enough may be avoided. In fact, in some prior approaches, Applicant has observed that the permeation of water vapor through the enclosure of a HDD is about 50-100 times slower than the permeation of water vapor through the desiccant device used thereby, and in some cases it is thought this range may be even larger, such as 25-250 times slower than the permeation rate for water vapor for the desiccant device. Consequently, embodiments of the invention adjust the permeability rate of a desiccant device used within HDD 100 to match or roughly equate the permeability rate of the enclosure of HDD 100 in which the desiccant device resides. For example, in this specific example, the adjusted water vapor permeability rate of a desiccant device according to an embodiment would be adjusted to be 50-100 times slower than the original water vapor permeability rate of the desiccant device.

The water permeability of a HDD may be determined based upon analysis performed on the design of each model of HDD. In other words, in certain embodiments, it may not be necessary to test the water vapor permeability rate for each HDD that is manufactured, but instead, the water vapor permeability rate of a model of HDD may be determined anytime a change is made to the design of the HDD. For example, a specific HDD family may consist of several models with different capacities, but as long as the technology is the same for the enclosure, the ratio of drive to desiccant rates will be the same and does not need testing. If, however, as part of cost reduction a different cover gasket material is used, the water permeation rate of the HDD enclosure should be remeasured and the rate of permeation of the desiccant adjusted.

To illustrate a concrete example, assume that a particular HDD that resides in storage has an internal relative humidity (RH) of 60% at 30° C. After the HDD is powered on and begins operation, the interior of the HDD warms to a 65° C. running temperature. As a consequence, the absolute humidity (AH) will change considerably, for example from 11 g/m$^3$ to 57 g/m$^3$. While the HDD is running, the environment outside of the HDD may be 25° C. with a relative humidity (RH) of 70% and an absolute humidity (AH) of 11 g/m$^3$. Thus, there will be a net flux of water out of the HDD to the external environment via diffusion.

However, as the water vapor concentration within the HDD decreases, the loss of water vapor in the interior of the HDD through diffusion will be offset by the influx of water vapor from the rapidly equilibrating desiccant, which is functioning as a reservoir and buffer for water vapor. By restricting the water vapor permeability rate of the desiccant device as accomplished by embodiments, the amount of water vapor expelled by the desiccant device at a given time should not be greater than the amount of water vapor lost to the outside of the HDD by diffusion.

An added advantage of lowering the water vapor permeability of the desiccant device will be to allow for less moisture absorption during manufacturing and/or to allow for more flexibility in terms of work-in-process (WIP) time for the HDD. For example, lowering the water vapor permeability of the desiccant device by 50-100 times to match the water vapor permeability of the HDD enclosure will lower moisture absorption by 50-100 times and allow for 50-100 times the amount of work-in-progress (WIP) time of the HDD.

Desiccant Devices may be Constructed in a Variety of Different Ways

In an embodiment, the material from which the desiccant device is made is selected to have a suitably low permeability to water. The purpose of doing so is to prevent a situation in which the water permeability rate of the desiccant device is an order of magnitude higher than that of the HDD enclosure. A desiccant device for use in a HDD is typically constructed of a formed or molded body enclosing the desiccant material. The desiccant device may, but need not, comprise a lid.

In prior approaches, the lid of the desiccant device, and possibly the entire body of the desiccant device, may be constructed of materials having a high water permeation rate. In contrast, according to embodiments of the invention, the body of the desiccant device is constructed out of a material having a water permeation rate that matches or is substantially similar to the water permeation rate of the HDD enclosure.

There are several ways in which this may be accomplished. For example, all of the material used to construct the body of the desiccant device may have a suitable low water permeation rate that, coupled with available area of the desiccant device, matches as needed to the water vapor permeation rate of the HDD enclosure.

As another example involving a desiccant device having a lid, the material comprised the desiccant device may have a negligible water permutation rate, while the material comprised the lid has a permeation rate that, coupled with the area of the lid, matches appropriately with the water vapor permeation rate of the HDD enclosure.

Figure 4:
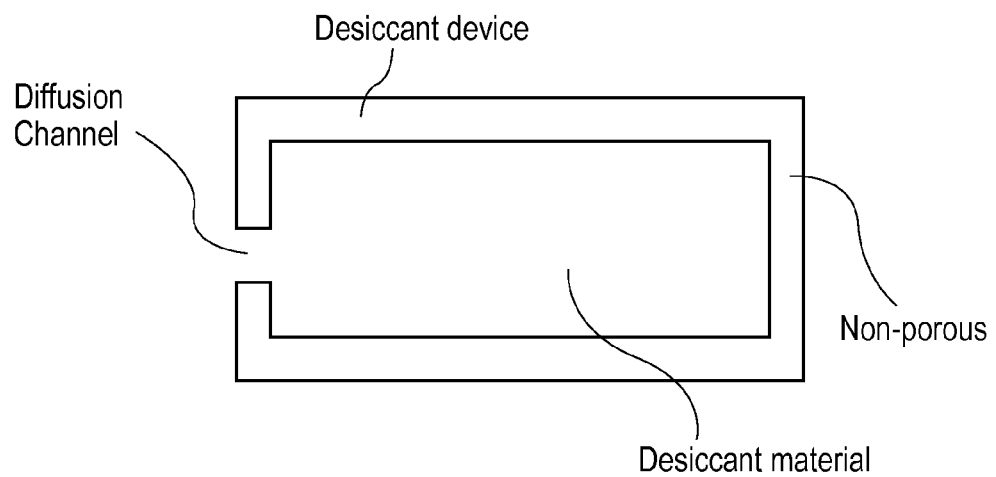
FIG. 4 is an illustration of a desiccant device having a diffusion channel according to an embodiment of the invention.

As an additional example involving a desiccant device having a lid, the material of the desiccant body and the material comprising the lid may have a negligible water vapor permeation rate; however, the desiccant body may have a diffusion channel whose length and area create a restriction to water vapor that is suitably matched to the water vapor transmission rate of the HDD enclosure. Such an approach is depicted in FIG. 4, which is an illustration of a desiccant device having a diffusion channel according to an embodiment of the invention. Note that the diffusion channel depicted in FIG. 4 is not to scale.

In some cases, attention should be given to providing a means for equalizing the pressure between the interior and the exterior of the desiccant device. This equalizing means may be very small or even, in suitable cases, rely on diffusion of gas between the interior and the exterior of the desiccant device through the materials composing the desiccant device.

Figure 3:
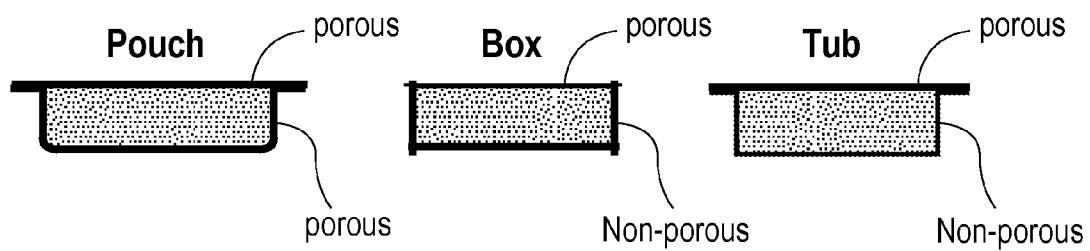
FIG. 3 is an illustration depicting several exemplary desiccant devices according to embodiments of the invention.

A desiccant device may be embodied in a variety of different forms. FIG. 3 is an illustration depicting several exemplary desiccant devices according to embodiments of the invention. As shown in FIG. 3, a desiccant device may be physically embodied as a variety of different structures, such as a pouch, a box, and a tub. The examples shown in FIG. 3 are not intended to depict all the forms in which a desiccant device may take, but are merely exemplary of several ways in which a desiccant device could be constructed.

As shown in FIG. 3, the contents of a pouch are entirely enclosed by a porous material, whereas the contents of a box or tub are partially non-porous. The non-porous surfaces of a desiccant device may be constructed using plastic material, while the porous surfaces of a desiccant device may be constructed using a microporous material that allows transmission of water vapor molecules therethrough. In an embodiment, the microporous material comprises at least one layer of expanded PolyTetraFluoroEthylense (ePTFE).

A desiccant device may be anywhere within the interior of HDD 100 in which the desiccant device is in communication with air space inside HDD 100. In an embodiment, the desiccant device may be affixed or positioned within the interior of HDD 100 such that the desiccant device is located in the flow of air when HDD 100 is operational.

ILLUSTRATIVE EXAMPLES OF DESICCANT DEVICES

Several, non-limiting, illustrative examples of various embodiments will now be presented. In one embodiment, the desiccant device may be constructed using a polymer film having suitable water vapor permeability, i.e., the permeability of the desiccant device matches or is substantially similar to the water vapor permeability of the enclosure of HDD 100. An example of the form that the desiccant device may take is a tube, bag, pouch, box, or tub. The desiccant device may be comprised from a material such as a polyetheramide, polyurethane, polyester, or polycarbonate. The desiccant device in this example may be constructed to have a portion that is made using a non-woven fabric that is laminated to form a very thin diffusion barrier layer of less water permeable materials than the remainder of the desiccant device. The non-woven fabric may be laminated on either side of the diffusion barrier film.

According to another embodiment, a portion (the "body") of the desiccant device is molded out of a material such as polypropylene so that the thickness and water permeability of the material making up the desiccant device body effectively prevents the transmission of water through the body of the desiccant device. The desiccant device may have a cover that is made of a material having a thickness and a water permeability rate to limit the transmission of water through the cover at a rate that matches or is substantially similar to the water permeability rate of the HDD enclosure. Such a material from which to construct the cover could be selected from polycarbonate, polyurethane, or similar materials. The material used to form the body of the desiccant device may be composed of a polymer film such that it is effectively water impermeable. Alternatively, the material used to form the body of the desiccant device may be an aluminized polyester or laminated foil used for moisture barrier bags. Other moisture barrier materials may be used to form the body of the desiccant device. Adjusting the water permeability rate of the desiccant device to match or be similar to the water permeability rate of the HDD enclosure may be achieved by forming a "window" or hole in the body of the desiccant device that is covered a different material. The type of material forming the desiccant device and the area of the window will affect the water permeability rate of the desiccant device. Examples of suitable materials for forming a desiccant device with a window are polyamides, polycarbonate, polyurethane, and a certain hard soft block copolymer material such as COPE. The window may be implemented using a window of a micro or nano porous material whose pore structure and density are selected to permit permeability matching with the HDD enclosure. Examples of such materials suitable for covering or forming the window are low stretched expanded PTFE and discrete pore filtering materials (such as EG Millipore™ and Nucleapore™)

According to another embodiment, the body of the desiccant device is formed out of a material such as polypropylene or polyester that, along with the selected thickness of the body, virtually prevents the transmission of water through the body of the desiccant device. In this embodiment, the desiccant device may comprise a lid that is comprised of similar materials. The lid may be constructed to have a channel (a "diffusion limiting channel") that limits diffusion by the ratio of cross sectional area to length. Exemplary dimensions of such a diffusion limiting channel are 14 mm long by 0.3 mm deep by 0.7 mm wide, giving an A/L (area/length) of approximately 0.015 cm. FIG. 4 depicts (not to scale) a desiccant device having a diffusion limiting channel according to an embodiment. These dimensions should be designed to provide the needed resistance to render the water permeability rate of the desiccant device to match or be substantially similar to the water permeability rate of HDD enclosure.

There are several ways to construct portions of a desiccant device of an embodiment to prevent or substantially prevent the transmission of water therethrough. For example, metail foil laminates and evaporated metal may be used to construct portions of a desiccant device, and such materials substantially prevent the transmission of water therethrough. Other examples of suitable materials include sputtered or Chem-Vapor Deposited materials such as silica and a laminate with a high resistance plastic (such as 3M ACLAR film which is a trade name for fluorochloro ethylene polymers).

The body of the desiccant device may be formed of a tube or bag formed from one laminate of a film having a low moisture transmission rate and another film having a high moisture transmission rate. The latter may be a nonwoven fabric or a micro porous material such as expanded PTFE. A film layer may be perforated by needle punch, laser ablation, spark discharge, or any other method to produce a plurality of holes of a very small and generally controlled size. The area of a hole and the density of the film create the restriction to the transmission of water therethrough.

The laminate may comprise multiple layers. For example, if the laminate comprises three layers, then the middle layer may be composed of dense non-woven fabric (such as calendared airlaid polyester) and the outer layers may be comprised of layers perforated by needle punch, laser ablation, spark discharge, or any other method to produce a plurality of holes. The dense laminate forms a restrictive layer between the two layers of small perforations. The process can be repeated to enhance resistance to the transmission of water vapor. Another manner of making filter media is etching a plurality of small holes following exposure to radiation or by other means to produce very fine holes in a layer.

In an embodiment, the desiccant device body may be molded using a material having a low water vapor transmission rate and a cover made from a similar material. The cover may be perforated by one or more micro capillaries of glass, plastic, or metal. The cross sectional area of the micro capillaries along with the length and number of the capillary tubes regulate the water permeation rate.

In another embodiment wherein the desiccant device comprises a body and a cover (or lid), the body and cover of the desiccant device are attached by means of a formed rubber gasket, such that high doses of radiation used to cure the gasket will produce a rough surface. The rough surface of the gasket creates a large plurality of very small channels. By adjusting the gasket material, does of radiation, fillers, etc., the water permeation rate of the gasket may be adjusted to result in the desiccant device having a matching or similar water permeability rate as the enclosure of the HDD.

It is noted that the particular means by which water permeation is limited to, and out of, the desiccant device may vary across embodiments, as illustrated in the discussion above.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. An enclosure protecting sensitive electronic equipment, comprising:
   a desiccant device, in the interior of the enclosure protecting the sensitive electronic equipment, enclosing a desiccant material, wherein the desiccant device possesses a first water vapor permeability rate (g/m²/day) that matches or is substantially similar to a second water vapor permeability rate (g/m²/day) of the enclosure protecting the sensitive electronic equipment.

2. The enclosure of claim 1, wherein the desiccant device comprises a diffusion channel.

3. The enclosure of claim 2, wherein the material from which the desiccant device is made prevents the transmission of water therethrough.

4. The enclosure of claim 1, wherein the material from which the desiccant device is made possesses a third water vapor permeability rate (g/m²/day) that matches or is substantially similar to the second water vapor permeability rate (g/m²/day) of the enclosure of the sensitive electronic equipment.

5. The enclosure of claim 4, wherein the material is polyetheramide, polyurethane, polyester, or polycarbonate.

6. The enclosure of claim 1, wherein the desiccant device comprises a plurality of capillaries or holes, and wherein physical dimensions of the plurality of capillaries or holes contribute to the first water vapor permeability rate (g/m²/day) of the desiccant device.

7. The enclosure of claim 1, wherein the desiccant device comprises a body and a cover, wherein the body and cover are attached using a formed rubber gasket, and wherein a surface of the formed rubber gasket comprises small channels that contribute to the first water vapor permeability rate (g/m²/day) of the desiccant device.

8. The enclosure of claim 1, wherein the desiccant device comprises a body and a cover, and wherein the material from which either the body or the cover is made prevents the transmission of water therethrough.

9. The enclosure of claim 1, wherein the desiccant device comprises a first material and a second material, wherein the first material is aluminized polyester or laminated foil, and wherein the second material is water vapor permeable.

10. The enclosure of claim 9, wherein the second material is low-stretched expanded PolyTetraFluoroEthylense (PTFE) or a discrete pore filtering material.

11. A hard-disk drive, comprising:
    an enclosure of the hard disk drive;
    a magnetic-recording head;
    a magnetic-recording disk rotatably mounted on a spindle; and
    a desiccant device, in the interior of the enclosure, enclosing a desiccant material,
       wherein the desiccant device possesses a first water vapor permeability rate (g/m²/day) that matches or is substantially similar to a second water vapor permeability rate (g/m²/day) of the enclosure of the hard-disk drive.

12. The hard-disk drive of claim 11, wherein the desiccant device comprises a diffusion channel.

13. The hard-disk drive of claim 12, wherein the material from which the desiccant device is made prevents the transmission of water therethrough.

14. The hard-disk drive of claim 11, wherein the material from which the desiccant device is made possesses a third water vapor permeability rate (g/m²/day) that matches or is substantially similar to the second water vapor permeability rate (g/m²/day) of the enclosure of the hard-disk drive.

15. The hard-disk drive of claim 14, wherein the material is polyetheramide, polyurethane, polyester, or polycarbonate.

16. The hard-disk drive of claim 11, wherein the desiccant device comprises a plurality of capillaries or holes, and wherein physical dimensions of the plurality of capillaries or holes contribute to the first water vapor permeability rate (g/m²/day) of the desiccant device.

17. The hard-disk drive of claim 11, wherein the desiccant device comprises a body and a cover, wherein the body and cover are attached using a formed rubber gasket, and wherein a surface of the formed rubber gasket comprises small channels that contribute to the first water vapor permeability rate (g/m²/day)of the desiccant device.

18. The hard-disk drive of claim 11, wherein the desiccant device comprises a body and a cover, and wherein the material from which either the body or the cover is made prevents the transmission of water therethrough.

19. The hard-disk drive of claim 11, wherein the desiccant device comprises a first material and a second material, wherein the first material is aluminized polyester or laminated foil, and wherein the second material is water vapor permeable.

20. The hard-disk drive of claim 19, wherein the second material is low-stretched expanded PolyTetraFluoroEthylense (PTFE) or a discrete pore filtering material.

* * * * *